United States Patent
Wang et al.

(10) Patent No.: US 10,658,214 B2
(45) Date of Patent: May 19, 2020

(54) WAFER PROCESSING DEVICE AND METHOD THEREFOR

(71) Applicant: SHANGHAI MICRO ELECTRONICS EQUIPMENT (GROUP) CO., LTD., Shanghai (CN)

(72) Inventors: Gang Wang, Shanghai (CN); Cuixia Tian, Shanghai (CN); Jie Jiang, Shanghai (CN); Shaoyu Wang, Shanghai (CN); Dong Ruan, Shanghai (CN)

(73) Assignee: SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 141 days.

(21) Appl. No.: 15/531,320

(22) PCT Filed: Nov. 24, 2015

(86) PCT No.: PCT/CN2015/095431
§ 371 (c)(1),
(2) Date: May 26, 2017

(87) PCT Pub. No.: WO2016/082746
PCT Pub. Date: Jun. 2, 2016

(65) Prior Publication Data
US 2017/0345696 A1    Nov. 30, 2017

(30) Foreign Application Priority Data

Nov. 26, 2014 (CN) .......................... 2014 1 0697547

(51) Int. Cl.
*H01L 21/677* (2006.01)
*H01L 21/683* (2006.01)
(Continued)

(52) U.S. Cl.
CPC ...... *H01L 21/67706* (2013.01); *G03F 7/2028* (2013.01); *H01L 21/67712* (2013.01);
(Continued)

(58) Field of Classification Search
None
See application file for complete search history.

(56) References Cited

U.S. PATENT DOCUMENTS 4,328,553 A * 5/1982 Fredriksen ............ H01L 21/681
125/13.01
4,836,733 A * 6/1989 Hertel ............... H01L 21/67259
198/341.05
(Continued)

FOREIGN PATENT DOCUMENTS

CN      1979792 A      6/2007
CN    100355055 C     12/2007
(Continued)

*Primary Examiner* — Dominic J Bologna
*Assistant Examiner* — Jarreas C Underwood
(74) *Attorney, Agent, or Firm* — Muncy, Geissler, Olds & Lowe, P.C.

(57) ABSTRACT

Disclosed in this invention is a wafer processing apparatus and method for pre-alignment and edge exposure of a wafer. The wafer processing apparatus includes a pre-alignment module, an edge exposure module, a motion module, a control module and a rotary table. The motion module includes a rotation module, a lifting module and a translation module, which are disposed and interconnected above one another. The rotation module is connected at the top to the rotary table and is configured to drive the rotary table to rotate together with the wafer. The lifting module is configured to drive the rotation module and the rotary table to move vertically. The translation module is configured to drive the lifting module and the rotation module to move horizontally. The pre-alignment module and the edge exposure module are positioned in correspondence to opposing (Continued)

sides of the wafer. The invention reduces the number of objects to be controlled as well as the complexity in control and system structure. Additionally, it simplifies the pre-alignment operation and reduces equipment cost.

20 Claims, 2 Drawing Sheets

(51) Int. Cl.
      *G03F 7/20*       (2006.01)
      *H01L 21/68*     (2006.01)
      *H01L 21/687*   (2006.01)

(52) U.S. Cl.
    CPC ............ H01L 21/68 (2013.01); H01L 21/681 (2013.01); H01L 21/6838 (2013.01); H01L 21/68735 (2013.01)

(56) References Cited

U.S. PATENT DOCUMENTS

| | | | | |
|---|---|---|---|---|
| 4,880,348 | A * | 11/1989 | Baker | H01L 21/68 414/783 |
| 5,043,973 | A * | 8/1991 | Ocheltree | G11B 17/028 360/903 |
| 5,264,918 | A * | 11/1993 | Kagami | H01L 21/681 356/150 |
| 5,452,521 | A * | 9/1995 | Niewmierzycki | H01L 21/68 33/520 |
| 6,517,130 | B1 * | 2/2003 | Donoso | B25J 15/0616 294/185 |
| 9,879,977 | B2 * | 1/2018 | Shchegrov | G01B 11/02 |
| 2007/0139642 | A1 * | 6/2007 | Ikeda | G01B 11/028 356/150 |
| 2008/0152474 | A1 * | 6/2008 | Scholte Van Mast | H01L 21/681 414/816 |
| 2009/0183583 | A1 * | 7/2009 | Nisany | G01R 31/2893 73/865.8 |
| 2010/0171966 | A1 * | 7/2010 | Yamamoto | H01L 21/681 356/614 |
| 2011/0024879 | A1 | 2/2011 | Wang | |
| 2013/0005056 | A1 * | 1/2013 | Kim | H01L 22/12 438/16 |
| 2013/0135458 | A1 | 5/2013 | Taniguchi et al. | |
| 2013/0265559 | A1 * | 10/2013 | Saito | G03F 7/70133 355/67 |

FOREIGN PATENT DOCUMENTS

| | | |
|---|---|---|
| CN | 101216686 * | 7/2008 |
| CN | 101216686 A | 7/2008 |
| CN | 101498897 A | 8/2009 |
| CN | 101640181 A | 2/2010 |
| CN | 101963766 A | 2/2011 |
| CN | 102157421 A | 8/2011 |
| CN | 102569113 A | 7/2012 |
| CN | 202434487 U | 9/2012 |
| CN | 102856224 A | 1/2013 |
| CN | 103034062 A | 4/2013 |
| CN | 203472680 A | 12/2013 |
| CN | 103811387 A | 5/2014 |
| CN | 104375395 A | 2/2015 |
| EP | 1045430 A2 | 10/2000 |
| JP | H0380528 A | 4/1991 |
| JP | H04212436 A | 8/1992 |
| JP | 3172085 B2 | 6/2001 |
| JP | 2006071395 A | 3/2006 |
| KR | 1020030090057 | 11/2003 |
| TW | 200743778 A | 12/2007 |
| TW | 200941630 A | 10/2009 |
| WO | WO 99/50891 * | 10/1999 |
| WO | WO9950891 A1 | 10/1999 |

* cited by examiner

WAFER PROCESSING DEVICE AND METHOD THEREFOR

TECHNICAL FIELD

The present invention relates to the field of integrated circuit (IC) fabrication and, more particularly, to a wafer processing apparatus and method.

BACKGROUND

Electroplating is one of several critical back-end IC packaging processes, in which a direct current is applied between the edge of a wafer, which serves as an anode, and a plating window at a center of the wafer, which acts as a cathode, and heights of resulting metal bumps are controlled by adjusting the magnitude of the current and the concentration of a plating solution in a plating tank.

Due to the non-conductive nature of photoresist, it is necessary to remove photoresist near the wafer edge before the electroplating process. The width of photoresist to be removed depends on a wafer edge exclusion (WEE) width of a previous exposure process. There are a large number of traditional WEE methods which can be generally divided into two groups: chemical WEE and edge exposure. Chemical WEE is accomplished by, during photoresist coating of a wafer, spraying a solvent on its edge so as to remove photoresist coated thereon. Such an approach suffers from several drawbacks such as a long process cycle, high cost due to the expensive solvent, and proneness of the solvent to be sprayed on the central pattern area of the wafer and thus significantly degrade pattern quality. In an edge exposure method, a wafer is vacuum-absorbed onto a rotary table, with a set of UV exposure lenses being arranged above the edge of the wafer and each configured to produce a uniform light spot of a certain size. Rotation of the rotary table allows the edge of the wafer to be exposed. Compared to chemical WEE, edge exposure offers a variety of advantages such as higher productivity, lower equipment cost and easier process control and etc.

During edge exposure, the wafer is pre-aligned after it is transferred onto the rotary table in order to eliminate possible errors occurring during the transfer that is conducted in a random manner, so as to achieve centering and notch orientation of the wafer. The centering is a process to move the wafer so that its centroid coincides with a centroid of the rotary table. The orientation is a process to rotate the wafer to align its notch with a predetermined position. These processes ensure the wafer to be exposed on the exposure table at a fixed position. The pre-alignment is a precise positioning of the wafer prior to the edge exposure, and its precision has a direct impact on the efficiency of the whole wafer processing apparatus.

Recently, the requirements from the market on pre-alignment and edge exposure, as well as on their degrees of automation, are getting more and more critical. Pre-alignment capabilities are required to handle not only a variety types of wafers such as through-hole wafers, warped wafers and ultra-thin wafers but also 6/8/12-inch wafers. Edge exposure capabilities are required to enable not only edge exposure, annular exposure, segment exposure and etc. but also exposure field of view (FoV) adjustment and exposure energy monitoring. At the same time, lowering the cost of wafer processing apparatuses is also in demand.

In the state of art, wafer pre-alignment and edge exposure are usually accomplished using two separate devices equipped with respective independent control systems, which take up large space. In addition, as there are many objects that need to be controlled and simultaneous control of motion axes including switching, rotation, lifting and centering axes is needed, the associated pre-alignment methods are tedious and the systems are complex, high-energy consuming and costly.

SUMMARY OF THE INVENTION

In order to overcome the above drawbacks, the present invention provides a wafer processing apparatus which is capable of both wafer pre-alignment and wafer edge exposure while reducing the number of objects to be controlled as well as system complexity.

To this end, the subject matter of the present invention is a wafer processing apparatus for pre-alignment and edge exposure of a wafer, which comprises: a rotary table, for carrying the wafer; a motion module, comprising, from top down, a rotation module, a lifting module and a translation module interconnected to one another, the rotation module being connected at a top thereof to the rotary table and configured to drive the rotary table to rotate together with the wafer, the lifting module being configured to drive the rotation module and the rotary table to move vertically and enabling the wafer to move at least between a first height and a second height, the translation module being configured to drive the lifting module and the rotation module to move horizontally; a pre-alignment module, configured to collect positional information of the wafer when the wafer is located at a pre-alignment height; an edge exposure module, configured to perform edge exposure on the wafer, wherein the pre-alignment module and the edge exposure module are positioned at opposing sides of the wafer; and a control module, electrically connected to the pre-alignment module, the edge exposure module and the motion module and configured to receive the positional information of the wafer and to control, based on the received information, the motion module to adjust a position of the rotary table so as to accomplish pre-alignment of the wafer, the control module being further configured to control the edge exposure module to accomplish the edge exposure of the wafer.

Additionally, the wafer processing apparatus can further comprise a fixation module, wherein each of the pre-alignment module, the edge exposure module, the motion module and the control module is connected to the fixation module, and wherein the translation module is horizontally moveable on a surface of the fixation module.

Additionally, the pre-alignment module can comprise a pre-alignment light source and a pre-alignment camera, wherein the pre-alignment light source is mounted at a height that is lower than the pre-alignment height, wherein the pre-alignment camera is mounted at a height that is higher than the pre-alignment height, and wherein upon the wafer being located at the pre-alignment height, the pre-alignment light source emits light which illuminates an edge of the wafer and then reaches the pre-alignment camera, followed by collecting positional information of the edge of the wafer by an image sensor.

Additionally, the pre-alignment light source can be a visible-spectrum light source.

Additionally, the pre-alignment of the wafer can comprise horizontal alignment of a center of the wafer with a center of the rotary table.

Additionally, the control module can comprise a data processing component configured to calculate an offset from the center of the wafer to the center of the rotary table and/or a position of an apex of a notch based on the collected positional information of the wafer.

Additionally, the edge exposure module can comprise an edge exposure camera located above an exposure height for the wafer, wherein the edge exposure camera has a central axis which, together with a central axis of the pre-alignment module, defines a plane passing through the center of the wafer, wherein the edge exposure camera comprises an exposure light source and a diaphragm with a variable field of view, wherein the exposure light source is disposed above the diaphragm, and wherein the exposure light source produces light which passes through the diaphragm and then exposes the wafer.

Additionally, the exposure height can be either same as the pre-alignment height or not.

Additionally, the exposure light source can be an ultraviolet light source.

Additionally, central axes of the rotation module, the lifting module and the translation module can be in coincidence with one another.

Additionally, wafer processing apparatus can further comprise a positioning table positioned between the first height and the second height, wherein the positioning table allows the rotary table but not the wafer to vertically pass therethrough, and wherein the positioning table is configured to retain the wafer by suction when the wafer is in proximity thereto.

Additionally, the positioning table can be a U-shaped structure open at one side, wherein an opening defined by the U-shaped structure has a radial dimension that is greater than a radial dimension of the rotation module and a radial dimension of the rotary table and is smaller than a radius of the wafer.

Additionally, the positioning table can retain the wafer in a two-point retention manner.

Additionally, one or more vacuum suction holes for absorptive retention of the wafer and several bumps for facilitating the retention can be provided on each side of the opening defined by the positioning table.

Additionally, each of the vacuum suction holes can be provided with a flexible suction cup that surrounds the vacuum suction hole.

Additionally, the wafer can be selected from differently-sized wafers, wherein the pre-alignment module and the edge exposure module are positioned at horizontal locations corresponding to respective locations at an edge of a wafer that has the largest one of the different sizes.

The present invention further provides a method for pre-alignment and edge exposure of a wafer using the wafer processing apparatus as defined above. The method comprises the steps of:

(1) initializing a position of the motion module;

(2) placing the wafer onto the rotary table such that the wafer is positionally fixed relative to the rotary table and determining a size of the wafer;

(3) based on the size of the wafer, the motion module moving the rotary table into positional correspondence with the pre-alignment module;

(4) the control module controlling the rotation module to rotate the rotary table together with the wafer, and concurrently the pre-alignment module collecting the positional information of the wafer and passing the information on to the control module;

(5) the control module controlling the motion module to adjust the position of the rotary table based on the received information about the position of the wafer, thereby accomplishing the pre-alignment of the wafer;

(6) based on the size of the wafer, causing the motion module to drive the rotary table to move into positional correspondence with the edge exposure module; and (7) the control module controlling the edge exposure module to perform the edge exposure of the wafer.

Additionally, the wafer processing apparatus can further comprise a positioning table disposed between the first height and the second height, wherein the positioning table allows the rotary table but not the wafer to vertically pass therethrough, and wherein the positioning table is configured to retain the wafer by suction when the wafer is in proximity thereto.

Additionally, the pre-alignment module in the wafer processing apparatus can comprise a pre-alignment light source and a pre-alignment camera, wherein the pre-alignment light source is mounted at a height that is lower than the pre-alignment height, wherein the pre-alignment camera is mounted at a height that is higher than the pre-alignment height, wherein upon the wafer being located at the pre-alignment height, the pre-alignment light source emits light which illuminates an edge of the wafer and then reaches the pre-alignment camera, followed by collecting positional information of the edge of the wafer by an image sensor.

Additionally, step (5) can comprise the steps of:

(5a) the control module controlling, based on the information about the offset from the center of the wafer to the center of the rotary table, the lifting module to drive the rotary table to move together with the wafer downward to a wafer-transfer location so that the wafer is retained by suction on the positioning table;

(5b) the lifting module driving the rotary table to further move downward to an adjustment location under the positioning table, wherein the adjustment location is between the positioning table and the lifting module;

(5c) the control module controlling the translation module to drive the rotary table to horizontally translate based on the offset such that the center of the rotary table is aligned with the center of the wafer;

(5d) the control module controlling the lifting module to drive the rotary table to move upward to the wafer transfer location where the wafer is released from the positioning table and transferred back onto the rotary table;

(5e) repeating steps (4) to (5d) until sufficient centering accuracy of the wafer is achieved;

(5f) the rotation module driving the rotary table to rotate until a notch in the wafer faces toward the pre-alignment camera;

(5g) the image sensor collecting positional information of the notch and transmitting the information to the control module, and the control module processing the positional information of the notch and determining a position of an apex of the notch;

(5h) the control module issuing an instruction to the rotation module, based on which the rotation module drives the wafer to rotate until the notch is located under the pre-alignment camera; and (5i) repeating steps (5g) to (5h) until sufficient orientation accuracy of the wafer is achieved.

Additionally, step (7) can comprise exposure of a designated location of the wafer or segment exposure of the wafer by means of adjusting the translation module and the rotation module through the control module.

In the wafer processing apparatus and method according to the present invention, both wafer pre-alignment and wafer edge exposure can be achieved through configuring the pre-alignment module and the edge exposure module, thus reducing the system footprint. In addition, pre-alignment and edge exposure for wafers of different sizes can be achieved through horizontal translation of the lifting module and the rotation module driven by the translation module 33. Further, as the single translation module performs the functionalities of both a switching axis and a centering axis, the number of objects to be controlled as well as the complexity in control and system structure is reduced, leading to significant reductions in energy consumption and cost.

In these figures, 1 denotes a pre-alignment module; 11, a pre-alignment light source; 12, a pre-alignment camera; 21, an edge exposure camera; 3, a motion module; 31, a rotation module; 32, a lifting module; 33, a translation module; 4, a control module; 5, a fixation module; 6, a rotary table; 7, a wafer; 8, a positioning table; 81, a vacuum suction hole; 82, a bump; 83, a flexible suction cup; and 9, a holder.

DETAILED DESCRIPTION

The present invention will be described in detail below with reference to the accompany drawings.

Figure 1:
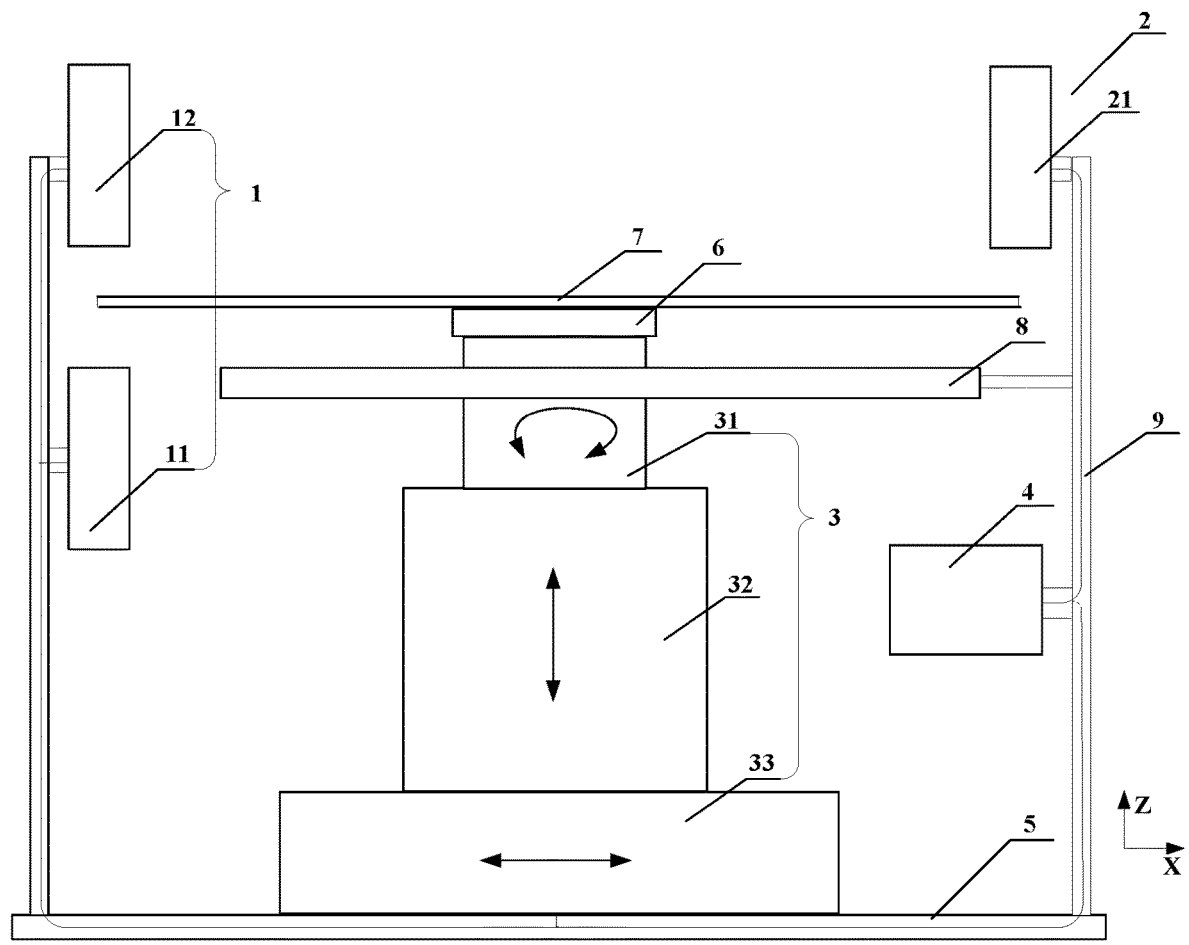
FIG. 1 is a structural schematic of a wafer processing apparatus according to the present invention.
Figure 2:
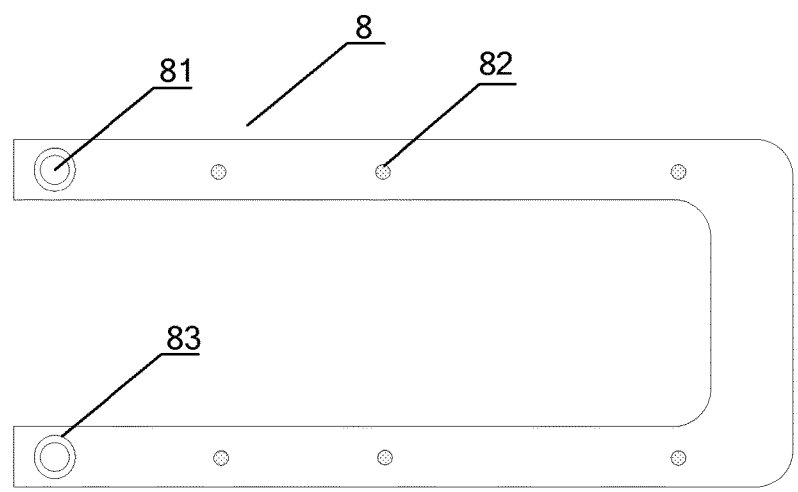
FIG. 2 is a structural schematic of a positioning table according to the present invention.

As shown in FIGS. 1 and 2, the present invention provides a wafer processing apparatus for pre-alignment and edge exposure of a wafer 7, comprising a pre-alignment module 1, an edge exposure module 2, a motion module 3, a control module 4, a fixation module 5, a rotary table 6 and a positioning table 8. The pre-alignment module 1, the edge exposure module 2, the motion module 3, the control module 4 and the positioning table 8 are all connected to the fixation module 5 via respective holders. The control module 4 is electrically connected to each of the pre-alignment module 1, the edge exposure module 2 and the motion module 3. The motion module 3 includes a rotation module 31, a lifting module 32 and a translation module 33, which are arranged and interconnected above one another and have their central axes coinciding with one another. The rotation module 31 is connected at the top to the rotary table 6 that is configured to carry and fix the wafer 7. The rotation module 31 drives the rotary table 6 to rotate and the positioning table 8 is disposed thereunder. The positioning table 8 is configured to retain the wafer 7 by suction. The lifting module 32 drives the rotation module 31 and the rotary table 6 to move vertically, i.e., in the Z-direction as shown in FIG. 1. The bottom of the translation module 33 is in sliding connection with the fixation module 5. In particular, a guide rail (not shown) may be provided on the surface of the fixation module 5 that comes into contact with the translation module 33, and a lever that mates with the guide rail is provided on a corresponding surface of the translation module 33. When driven by a motor (not shown), the translation module 33 can drive the lifting module 32 and the rotation module 31 to move horizontally along the guide rail on the fixation module 5, i.e., in the X-direction as shown in FIG. 1. The pre-alignment module 1 and the edge exposure module 2 correspond to respective opposing edge locations of the wafer 7. Specifically, the wafer 7 may have a radius of 6, 8 or 12 inches, and in case of the wafer 7 with a radius of 12 inches, central axes of the pre-alignment module 1 and the edge exposure module 2 may correspond to two locations at the edge of the wafer that oppose each other along the X-direction.

With the wafer being located at a pre-alignment height, the rotation module 31 first drives the rotary table 6 to rotate along with the wafer 7. At the same time, the pre-alignment module 1 gathers information about the position of the wafer 7 and passes the information on to the control module 4. Subsequently, the control module 4 controls the motion module 3 to adjust the position of the wafer 7, thereby accomplishing the pre-alignment thereof. After that, the control module 4 controls the motion module 3 and the edge exposure module 2 to perform edge exposure on the wafer 7.

The pre-alignment module 1 includes a pre-alignment light source 11 and a pre-alignment camera 12. The pre-alignment light source 11 is a visible-spectrum light source located under one of the wafer edge locations opposing each other along the X-direction. That is, the pre-alignment light source 11 is mounted at a height that is lower than the pre-alignment height. The pre-alignment camera 12 is located above the edge location of the wafer 7 corresponding to the pre-alignment light source 11. That is, the pre-alignment camera 12 is mounted at a height that is higher than the pre-alignment height. With the wafer being located at the pre-alignment height, the pre-alignment light source 11 emits light that illuminates the edge location of the wafer 7 and then reaches the pre-alignment camera 12. An image sensor (not shown) collects positional data of the wafer edge and data of a notch in the wafer and transmits the collected data to a data processing component in the control module 4. The data processing component then calculates an offset from a center of the wafer to a center of the rotary table and/or the position of the apex of the notch.

The edge exposure module 2 includes an edge exposure camera 21 located above an exposure height for the wafer 7, for example, above the edge of the wafer 7, as shown in FIG. 1, wherein the exposure height may be either the same as the pre-alignment height or not. A plane where a central axis of the edge exposure camera 21 and the central axis of the pre-alignment module 1 are located passes through the center of the wafer. The edge exposure camera 21 comprises an exposure light source and a diaphragm having a variable field of view (both not shown). The exposure light source is an ultraviolet (UV) light source and is located above the diaphragm. Light emanated from the exposure light source passes through the diaphragm and then exposes the wafer.

The positioning table 8 is a U-shaped structure open at one side, and the open side corresponds to the pre-alignment module 1. That is, the open side faces toward the pre-alignment module 1. An opening defined by the U-shaped structure has a radial dimension that is greater than a radial dimension of the rotation module 21 and that of the rotary table 6 and is smaller than the radius of the wafer 7. That is, the rotation module 21 and the rotary table 6 can both pass through the opening of the positioning table 8 while the wafer 7 cannot. The positioning table 8 retains the wafer 7 by suction in a two-point retention manner. In particular, on each arm of the positioning table 8's U-shaped structure, there may be provided one or more vacuum suction holes 81 for absorptive retention of the wafer 7 as well as several bumps 82 for facilitating the retention. As shown in FIG. 2, the vacuum suction holes 81 are configured to retain the wafer 7 at the side proximal to the pre-alignment module 1, while bumps 82 are adapted to facilitate the retention at the side distal to the pre-alignment module 1 in order to obtain better fixation of the wafer 7. The bumps 82 are arranged at locations compatible with the sizes of 6-, 8- and 12-inch wafers 7. Preferably, each vacuum suction hole 81 may be further provided with a flexible suction cup 83 surrounding the hole for higher performance of the positioning table 8 in retaining through-hole wafers, warped wafer and other non-standard wafers.

Figure 3:
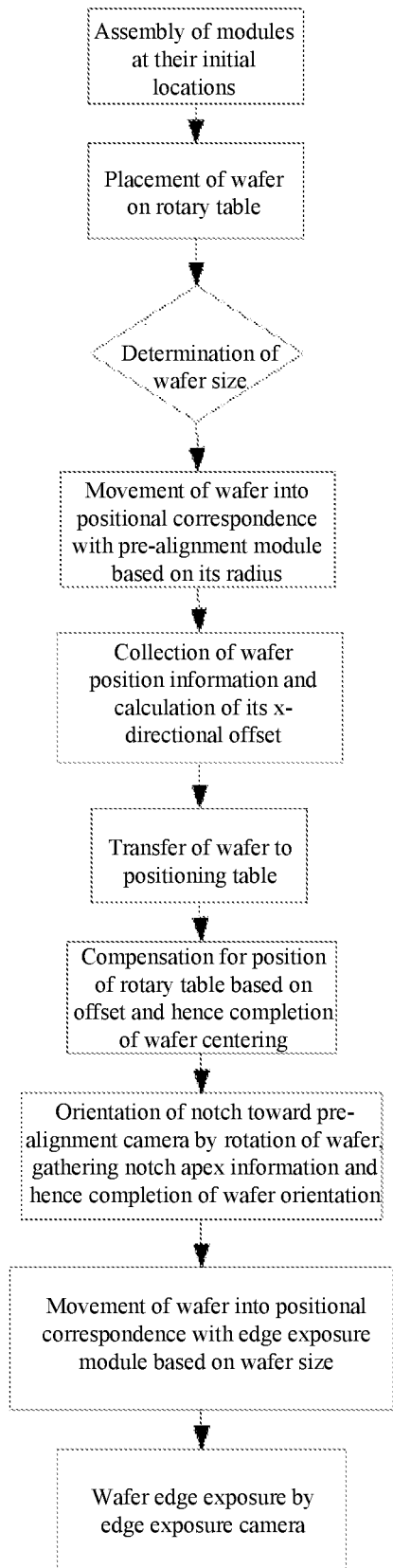
FIG. 3 is a flowchart illustrating a method for processing a wafer using the wafer processing apparatus according to the present invention.

As shown in FIG. 3, a method for pre-alignment and edge exposure of a wafer 7 of one of several different sizes using the above-described wafer processing apparatus includes the following steps:

(1) The pre-alignment module 1, the edge exposure module 2, the motion module 3, the control module 4, the fixation module 5, the rotary table 6 and the positioning table 8 are so assembled that they are positioned at respective predetermined locations. That is, the pre-alignment module 1 and the edge exposure module 2 are located, equidistantly with respect to the center of a motion module 3, with their central axes corresponding to two locations at an edge of a 12-inch wafer 7 that oppose each other along the X-direction.

(2) The wafer 7 is placed onto the rotary table 6 such that the wafer 7 is positionally fixed relative to the rotary table 6, and the size of the wafer 7 is determined, in particular, in a manual manner.

(3) The motion module 3 drives the rotary table 6 to move toward the pre-alignment module 1 by a distance corresponding to a radius of the wafer 7. In particular, in case of the radius of the wafer 7 being 12 inches, the translation module 33 is not moved; if the radius of the wafer 7 is 8 inches, the control module 4 drives the translation module 33 to move a distance, preferably 50 mm in this case, toward the pre-alignment module 1 so that the edge of the 8-inch wafer 7 comes into positional correspondence with the pre-alignment module 1; and when the radius of the wafer 7 is 6 inches, the control module 4 drives the translation module 33 to move a distance, preferably 75 mm in this case, toward the pre-alignment module 1 so that the edge of the 6-inch wafer 7 comes into positional correspondence with the pre-alignment module 1.

(4) The control module 4 controls the rotation module 31 to drive the rotary table 6 to rotate together with the wafer 7, and concurrently, the image sensor collects positional information of the wafer 7 and passes the information on to the data processing component in the control module 4. In particular, the pre-alignment light source 11 emits a visible light beam which illuminates the edge of the wafer 7 and then reaches the pre-alignment camera 12. Subsequently, the image sensor collects data of the edge of the wafer 7 at a predetermined sampling frequency and transmits the data to the data processing component. In order to include as many sampling points as possible, the sampling may be performed at a frequency as high as possible for a sufficiently long period of time. That is, in one sampling cycle, the data is sampled with the wafer being rotated several turns. Based on the sampled data, the data processing component calculates an offset from a center of the wafer 7 to a center of the rotary table 6 with respect to the X-direction. It is noted that since both the rotary table 6 and the wafer 7 are circular, they are both centered in the X-direction.

(5) Based on the information about the offset from the center of the wafer 7 to the center of the rotary table 6, the control module 4 controls the motion module 3 to adjust the position of the rotary table 6, thereby completing the pre-alignment of the wafer 7. This may specifically include the following three steps:

(5a) Based on the information about the offset from the center of the wafer 7 to the center of the rotary table 6, the control module 4 controls the lifting module 32 to drive the rotary table 6 to move together with the wafer 7 downward to a wafer-transfer location, i.e., a top side of the positioning table 8, where the wafer 7 is transferred to and retained by suction on the positioning table 8. The lifting module 32 then drives the rotary table 6 to further move downward to an adjustment location under the positioning table 8. The adjustment location is between the positioning table 8 and the lifting module 32 and its position may be specifically selected according to practical needs.

(5b) The control module 4 controls the translation module 33 to drive the rotary table 6 to perform an X-directional compensation based on the offset such that the center of the rotary table 6 comes into coincidence with that of the wafer 7. Subsequent to the completion of the adjustment, the control module 4 controls the lifting module 32 to drive the rotary table 6 to move upward to the wafer transfer location where the wafer 7 is released from the positioning table 8 and transferred back onto the rotary table 6.

(5c) Steps (4)-(5b) are repeated until sufficient centering accuracy of the wafer 7 is achieved.

(5d) The rotation module 31 drives the rotary table 6 to rotate until the notch in the wafer 7 faces toward the pre-alignment camera 12. The image sensor then gathers positional information of the notch which is processed by the data processing component to determine the position of the apex of the notch. The control module 4 issues an instruction to the rotation module 31, based on which the rotation module 31 drives the wafer to rotate until the notch is located under the pre-alignment camera 12. The rotation module 31 rotates forward and backward over small angles for 2-3 times to enable accurate collection of notch data. The data is uploaded and processed and then fed back to rotation module 31 for use in angular compensation and accurate orientation of the wafer 7.

(6) The motion module 3 drives the rotary table 6 to move toward the edge exposure module 2 a distance corresponding to the size of the wafer 7. In particular, in case of the radius of the wafer 7 being 12 inches, the translation module 33 is not moved; if the radius of the wafer 7 is 8 inches, the control module 4 drives the translation module 33 to move a distance, preferably 100 mm in this case, toward the edge exposure module 2 so that the edge of the 8-inch wafer 7 comes into positional correspondence with the edge exposure module 2; and when the radius of the wafer 7 is 6 inches, the control module 4 drives the translation module 33 to move a distance, preferably 150 mm in this case, toward the edge exposure module 2 so that the edge of the 6-inch wafer 7 comes into positional correspondence with the edge exposure module 2.

(7) The edge exposure module 2 performs edge exposure on the wafer 7 under the control of the control module 4. In particular, the control module 4 activates the exposure light source so that UV light is produced, and configures a width of exposure according to practical needs by adjusting the diaphragm with a variable field of view. The UV light passes through the diaphragm and then accomplishes the edge exposure for the wafer 7.

Exposure of a designated location of the wafer 7 or segment exposure thereof can be further accomplished by adjusting the translation module 33 and the rotation module 31 using the control module 4.

In summary, in the wafer processing apparatus and method according to the present invention, both pre-alignment and edge exposure for the wafer 7 can be achieved through configuring the pre-alignment module 1 and the edge exposure module 2, thus reducing the system footprint.

In addition, pre-alignment and edge exposure for wafers 7 of different sizes can be achieved through horizontal translation of the lifting module 32 and the rotation module 31 driven by the translation module 33. As the single translation module 33 performs the functionalities of both a switching axis and a centering axis, the number of objects to be controlled as well as the complexity in control and system structure is reduced, leading to significant reductions in energy consumption and cost.

Although specific embodiments of the present invention have been described herein, these disclosed embodiments are merely illustrative and do not limit the scope of the present invention in any sense. It is intended that all omissions, substitutions, and alterations made without departing from the spirit of the invention are embraced within the scope thereof.

What is claimed is:

1. A wafer processing apparatus for pre-alignment and edge exposure of a wafer, comprising:
    a rotary table, for carrying the wafer;
    a motion module comprising, from top down, a rotation module, a lifting module and a translation module interconnected to one another, the rotation module being connected at a top thereof to the rotary table and configured to drive the rotary table to rotate together with the wafer, the lifting module being configured to drive the rotation module and the rotary table to move vertically and enabling the wafer to move at least between a first height and a second height, the translation module being configured to drive the lifting module and the rotation module to move in only one horizontal direction;
    a pre-alignment module, configured to collect positional information of the wafer when the wafer is located at a pre-alignment height;
    an edge exposure module, configured to perform edge exposure on the wafer, wherein the pre-alignment module and the edge exposure module are positioned at opposing sides of the wafer;
    a control module, electrically connected to the pre-alignment module, the edge exposure module and the motion module and configured to receive the positional information of the wafer and to control, based on the received information, the motion module to adjust a position of the rotary table so as to accomplish pre-alignment of the wafer, the control module being further configured to control the edge exposure module to accomplish the edge exposure of the wafer, wherein the control module is configured to perform centering operation using only rotation and a single-axis linear movement in a plane of the wafer; and
    a positioning table positioned between the first height and the second height, wherein the positioning table allows the rotary table but not the wafer to vertically pass therethrough, and wherein the positioning table is configured to retain the wafer by suction when the wafer is in proximity thereto.

2. The wafer processing apparatus according to claim 1, further comprising a fixation module, wherein each of the pre-alignment module, the edge exposure module, the motion module and the control module is connected to the fixation module, and wherein the translation module is horizontally moveable on a surface of the fixation module.

3. The wafer processing apparatus according to claim 1, wherein the pre-alignment module comprises a pre-alignment light source and a pre-alignment camera, the pre-alignment light source being mounted at a height that is lower than the pre-alignment height, the pre-alignment camera being mounted at a height that is higher than the pre-alignment height, wherein upon the wafer being located at the pre-alignment height, the pre-alignment light source emits light which illuminates an edge of the wafer and then reaches the pre-alignment camera, followed by collecting positional information of the edge of the wafer by an image sensor.

4. The wafer processing apparatus according to claim 3, wherein the pre-alignment light source is a visible-spectrum light source.

5. The wafer processing apparatus according to claim 1, wherein the pre-alignment of the wafer comprises horizontal alignment of a center of the wafer with a center of the rotary table.

6. The wafer processing apparatus according to claim 5, wherein the control module comprises a data processing component configured to calculate an offset from the center of the wafer to the center of the rotary table and/or a position of an apex of a notch based on the collected positional information of the wafer.

7. The wafer processing apparatus according to claim 5, wherein the edge exposure module comprises an edge exposure camera located above an exposure height for the wafer, the edge exposure camera having a central axis which, together with a central axis of the pre-alignment module, defines a plane passing through the center of the wafer, the edge exposure camera comprising an exposure light source and a diaphragm with a variable field of view, the exposure light source being disposed above the diaphragm, the exposure light source producing light which passes through the diaphragm and then exposes the wafer.

8. The wafer processing apparatus according to claim 7, wherein the exposure height is either as same as the pre-alignment height or not.

9. The wafer processing apparatus according to claim 7, wherein the exposure light source is an ultraviolet light source.

10. The wafer processing apparatus according to claim 1, wherein central axes of the rotation module, the lifting module and the translation module are in coincidence with one another.

11. The wafer processing apparatus according to claim 1, wherein the positioning table is a U-shaped structure open at one side, and wherein an opening defined by the U-shaped structure has a radial dimension that is greater than a radial dimension of the rotation module and a radial dimension of the rotary table and is smaller than a radius of the wafer.

12. The wafer processing apparatus according to claim 11, wherein the positioning table retains the wafer in a two-point retention manner.

13. The wafer processing apparatus according to claim 11, wherein one or more vacuum suction holes for absorptive retention of the wafer and several bumps for facilitating the retention are provided on each side of the opening defined by the positioning table.

14. The wafer processing apparatus according to claim 13, wherein each of the vacuum suction holes is provided with a flexible suction cup that surrounds the vacuum suction hole.

15. The wafer processing apparatus according to claim 1, wherein the wafer is selected from wafers of different sizes, and wherein the pre-alignment module and the edge exposure module are positioned at horizontal locations corresponding to respective locations at an edge of a wafer that has the largest one of the different sizes.

16. A method for pre-alignment and edge exposure of a wafer using the wafer processing apparatus as defined in claim 1, comprising the steps of:
   (1) initializing a position of the motion module;
   (2) placing the wafer onto the rotary table such that the wafer is positionally fixed relative to the rotary table and determining a size of the wafer;
   (3) based on the size of the wafer, the motion module moving the rotary table into positional correspondence with the pre-alignment module;
   (4) the control module controlling the rotation module to rotate the rotary table together with the wafer, and concurrently the pre-alignment module collecting the positional information of the wafer and passing the information on to the control module;
   (5) the control module controlling the motion module to adjust the position of the rotary table based on the received positional information of the wafer, thereby accomplishing the pre-alignment of the wafer;
   (6) based on the size of the wafer, causing the motion module to drive the rotary table to move into positional correspondence with the edge exposure module; and
   (7) the control module controlling the edge exposure module to perform the edge exposure of the wafer.

17. The method according to claim 16, wherein the wafer processing apparatus further comprises a positioning table disposed between the first height and the second height, wherein the positioning table allows the rotary table but not the wafer to vertically pass therethrough, and wherein the positioning table is configured to retain the wafer by suction when the wafer is in proximity thereto.

18. The method according to claim 17, wherein the pre-alignment module in the wafer processing apparatus comprises a pre-alignment light source and a pre-alignment camera, the pre-alignment light source being mounted at a height that is lower than the pre-alignment height, the pre-alignment camera being mounted at a height that is higher than the pre-alignment height, wherein upon the wafer being located at the pre-alignment height, the pre-alignment light source emits light which illuminates an edge of the wafer and then reaches the pre-alignment camera, followed by collecting positional information of the edge of the wafer by an image sensor.

19. The method according to claim 18, wherein step (5) comprises the steps of:
   (5a) the control module controlling, based on information about an offset from a center of the wafer to a center of the rotary table, the lifting module to drive the rotary table to move together with the wafer downward to a wafer-transfer location so that the wafer is retained by suction on the positioning table;
   (5b) the lifting module driving the rotary table to further move downward to an adjustment location under the positioning table, wherein the adjustment location is between the positioning table and the lifting module;
   (5c) the control module controlling the translation module to drive the rotary table to horizontally translate based on the offset such that the center of the rotary table is aligned with the center of the wafer;
   (5d) the control module controlling the lifting module to drive the rotary table to move upward to the wafer transfer location where the wafer is released from the positioning table and transferred back onto the rotary table;
   (5e) repeating steps (4) to (5d) until sufficient centering accuracy of the wafer is achieved;
   (5f) the rotation module driving the rotary table to rotate until a notch in the wafer faces toward the pre-alignment camera;
   (5g) the image sensor collecting positional information of the notch and transmitting the positional information to the control module, and the control module processing the positional information of the notch and determining a position of an apex of the notch;
   (5h) the control module issuing an instruction to the rotation module, based on which the rotation module drives the wafer to rotate until the notch is located under the pre-alignment camera; and
   (5i) repeating steps (5g) to (5h) until a predefined orientation accuracy of the wafer is achieved.

20. The method according to claim 18, wherein step (7) comprises exposure of a designated location of the wafer or segment exposure of the wafer by means of adjusting the translation module and the rotation module through the control module.

* * * * *